(12) United States Patent
Shima

(10) Patent No.: US 7,573,405 B2
(45) Date of Patent: Aug. 11, 2009

(54) SYSTEM UPDATING ACCUMULATED STATISTICS CODING VARIABLE VALUES AFTER MULTIPLE ENCODINGS

(75) Inventor: Masato Shima, Ibaraki (JP)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 11/964,890

(22) Filed: Dec. 27, 2007

(65) Prior Publication Data

US 2008/0165036 A1    Jul. 10, 2008

Related U.S. Application Data

(60) Provisional application No. 60/882,741, filed on Dec. 29, 2006.

(51) Int. Cl.
*H03M 7/34* (2006.01)
(52) U.S. Cl. .......................... 341/51; 341/107
(58) Field of Classification Search .......... 341/107, 341/106, 50, 51; 382/244, 245, 246, 247
See application file for complete search history.

(56) References Cited

U.S. PATENT DOCUMENTS

| | | | | |
|---|---|---|---|---|
| 5,684,962 A | * | 11/1997 | Black et al. | 709/238 |
| 7,286,710 B2 | * | 10/2007 | Marpe et al. | 382/239 |
| 7,365,659 B1 | * | 4/2008 | Hoffmann et al. | 341/107 |

* cited by examiner

*Primary Examiner*—Brian Young
(74) *Attorney, Agent, or Firm*—Lawrence J. Bassuk; W. James Brady; Frederick J. Telecky, Jr.

(57) ABSTRACT

A system for, and method of, entropy coding. In one embodiment, the system includes: (1) a memory configured to contained initialized accumulated statistics coding variable values and (2) a processor configured to employ the initialized accumulated statistics coding variable values to context-adaptive encode multiple symbols until an accumulated statistics update condition occurs and updating and store the accumulated statistics coding variable values in the memory only upon occurrence of the accumulated statistics update condition.

7 Claims, 9 Drawing Sheets

SYSTEM UPDATING ACCUMULATED STATISTICS CODING VARIABLE VALUES AFTER MULTIPLE ENCODINGS

CROSS-REFERENCE TO PROVISIONAL APPLICATION

This application claims the benefit of U.S. Provisional Application Ser. No. 60/882,741, filed Dec. 29, 2006, by Shima, entitled "Video Coding," commonly assigned with the invention and incorporated herein by reference. Co-assigned U.S. Pat. No. 7,176,815, issued Feb. 13, 2007, to Hung, et al., entitled "Video Coding with CABAC," discloses related subject matter.

TECHNICAL FIELD OF THE INVENTION

The invention is directed, in general, to digital video signal processing and, more specifically, to a system and method for video coding having a reduced computational intensity.

BACKGROUND OF THE INVENTION

Multiple applications for digital video communication and storage currently exist, and multiple international standards have been and are continuing to be developed in response. Low bit rate communications, such as video telephony and videoconferencing, led the International Telecommunication Union (ITU) to develop the H.261 standard with bit rates as multiples of 64 kbps and the Motion Picture Experts Group (MPEG) to develop the MPEG-1 standard, which provides picture quality comparable to that of Video Home System (VHS) videotape.

ITU-T H.264/MPEG-4 is a recent video coding standard that makes use of several advanced video coding tools to provide better compression performance than existing video coding standards such as MPEG-2, MPEG-4, and ITU H.263. The core of all of these standards is a hybrid video coding technique of block motion compensation plus transform coding.

Generally, block motion compensation is used to remove temporal redundancy between successive images (frames), whereas transform (e.g., discrete cosine transformation, or DCT) coding is used to remove spatial redundancy within each frame. As will be illustrated below, H.264/AVC functions include quantization of the transforms of block prediction errors (either from block motion compensation or from intra-frame prediction and based upon macroblocks, or MBs, of 16 pixels by 16 pixels). The quantized transform coefficients are entropy encoded. A rate control unit is responsible for generating a quantization parameter (qp) by adapting to a target transmission bit rate and output buffer-fullness; a larger quantization step implies more vanishing and/or smaller quantized transform coefficients which means fewer and/or shorter codewords and consequent smaller bit rates and files. The entropy coding for the quantized transform coefficients may be either context-adaptive variable-length coding (CAVLC) or context-based adaptive binary arithmetic coding (CABAC).

More generally, after quantizing, the computed signals are converted to several meaningful symbols, and each symbol is encoded with some entropy coding technology. Because the essence of entropy coding is to assign shorter codewords to more frequent symbols and longer codewords to less frequent symbols, entropy coding modules typically employ lookup tables of variable-length coding (VLC) codewords (often called "VLC tables") to encode symbols efficiently.

As video coding standards expand, they have begun to encounter advanced applications that would particularly benefit from higher compression efficiency. To achieve higher compression efficiency, recent video coding standards have made several modifications to previous entropy coding techniques. The idea common among these modifications is adaptive switching of the coding parameters so that the size of the generated coefficients may be minimized. Typical categories of techniques used in recent video coding standards are:

(1) Coding as side information: Coding parameters (VLC table indexes in most cases) are encoded as side information. A decoder decodes the side information to use the designated coding parameters.

(2) Computing from surrounding information: Based on the recognition that spatially neighboring coefficients tend to have some similarity, coding parameters are computed from information regarding surrounding coefficients.

(3) Using accumulated statistics: An initial set of coding parameters is generated and thereafter updated based on the coded symbols.

Category (3) includes the adaptive VLC scheme used in scalable video coding (SVC), which is currently being standardized as Annex G of H.264/AVC. In a wider sense, the arithmetic coding technology used in the Joint Photographic Experts Group (JPEG) 2000 standard and the H.264/AVC standard are classified in category (3) as well, because the context of the arithmetic coder is updated depending on the coded binary symbols. In this way, the entropy coding technique using accumulated statistics (hereinafter denoted as "accumulated statistics-based entropy coding") is used in various coding standards.

Though they are effective, the computational intensity of the CAVLC of H.264/AVC and the adaptive VLC of SVC (Annex G of H.264/AVC) and other such methods presents a problem, especially for mobile, battery-powered devices such as digital cameras.

SUMMARY OF THE INVENTION

To address the above-discussed deficiencies of the prior art, the invention provides modified versions of accumulated statistics-based entropy coding with parameter updating separated from and asynchronous with respect to the symbol coding.

One aspect of the invention provides a system for entropy coding. In one embodiment, the system includes: (1) a memory configured to contained initialized accumulated statistics coding variable values and (2) a processor configured to employ the initialized accumulated statistics coding variable values to context-adaptive encode multiple symbols until an accumulated statistics update condition occurs and updating and store the accumulated statistics coding variable values in the memory only upon occurrence of the accumulated statistics update condition.

Another aspect of the invention provides a method of entropy coding. In one embodiment, the method includes: (1) initializing accumulated statistics coding variable values, (2) context-adaptive encoding multiple symbols using the accumulated statistics coding variable values until an accumulated statistics update condition occurs and (3) updating the accumulated statistics coding variable values only upon occurrence of the accumulated statistics update condition.

Yet another aspect of the invention provides a method of accumulated statistics-based entropy coding. In one embodiment, the method includes: (a) initializing accumulated statistics coding variable values, (b) context-adaptive encoding a symbol using current accumulated statistics variable values, (c) when an update condition occurs, updating the accumulated statistics variable values and (d) repeating steps (b)-(c) until all symbols are encoded.

Still another aspect of the invention provides a method of accumulated statistics-based entropy coding. In one embodiment, the method includes: (a) performing a core coding process of an accumulated statistics-based entropy coding scheme, (b) when a discrete point occurs, performing an updating process, otherwise do not update and (c) repeating steps (a)-(b) until a coding is complete.

BRIEF DESCRIPTION OF THE DRAWINGS

For a more complete understanding of the invention, reference is now made to the following descriptions taken in conjunction with the accompanying drawings, in which.

DETAILED DESCRIPTION

As described but not illustrated above, H.264/AVC functions include quantization of the transforms of block prediction errors (either from block motion compensation or from intra-frame prediction and based upon macroblocks of 16 pixels by 16 pixels). The quantized transform coefficients are entropy encoded.

Figure 1A:
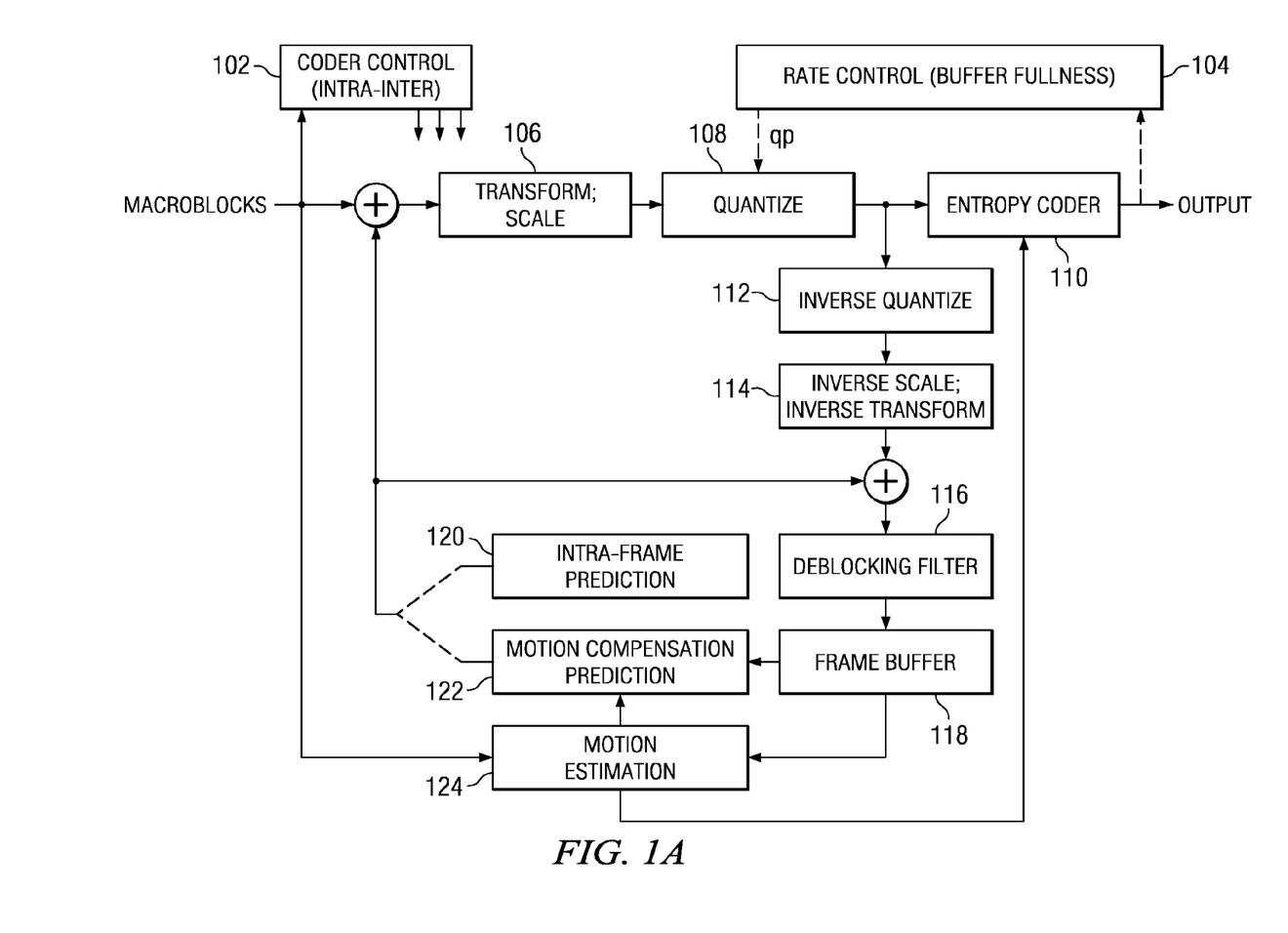
FIGS. 1A-1B are respective block diagrams of an H.264/AVC encoder and decoder that together form an environment within which an accumulated statistics-based entropy coding system or method of the invention may be employed.
Figure 1B:
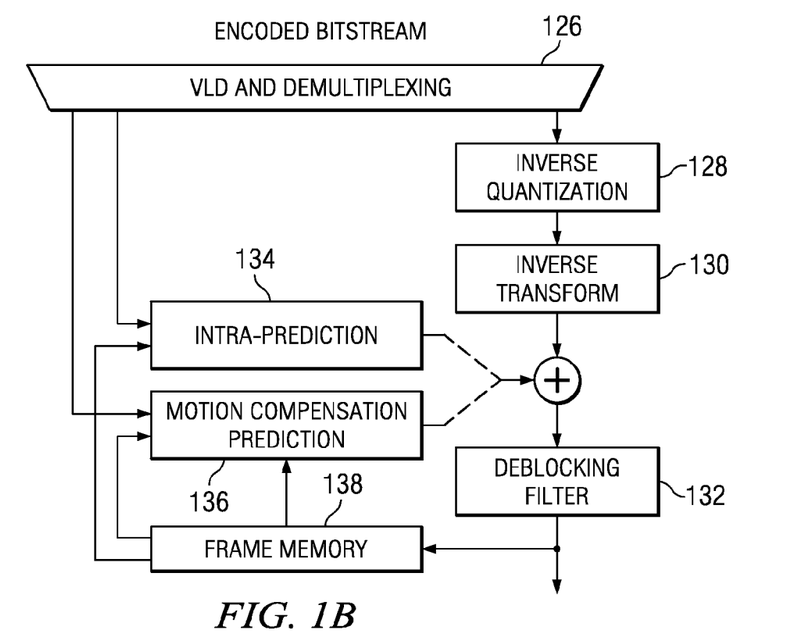

FIGS. 1A-1B are respective block diagrams of an H.264/AVC encoder and decoder that together form an environment within which an accumulated statistics-based entropy coding system or method of the invention may be employed. The encoder, shown in FIG. 1A, employs a coder control unit 102 and a rate control unit 104 to provide overall control of the encoder. The rate control unit 104 is responsible for generating the above-mentioned quantization parameter (qp). Macroblocks are provided to a transform/scale unit 106, a quantizer 108 and an entropy encoder 110. An inverse quantizer 112 and an inverse scale/transform unit 114 provide an input to a deblocking filter 116 and a frame buffer 118 which, in turn, provides an input to a motion compensation prediction unit 122 and a motion estimation unit 124. Together with an intra-frame prediction unit 120, the motion compensation prediction unit 122 feeds back information to the transform/scale unit 106 and the deblocking filter 116.

The decoder, shown in FIG. 1B, receives an encoded bitstream into a variable-length decoder (VLD) and demultiplexer 126. Output is provided to an inverse quantization unit 128, an inverse transform unit 130 and, together with output from an intra prediction unit 134 and a motion compensation prediction unit 136, a deblocking filter 132. A frame memory 138 receives the decoded output from the deblocking filter 132, buffering it for the intra prediction unit 134 and the motion compensation prediction unit 136.

1. Overview

Various embodiments of a methods of accumulated statistics-based entropy coding to be described herein provide separate symbol encoding and parameter updating modules which may be asynchronously executed: encoding is continually executed but parameter updating is executed only when one of a set of discrete conditions (points) arises.

Various systems (e.g., cellphones, personal digital assistants (PDAs), digital cameras and notebook computers) may perform a method carried out according to the principles of the invention and described herein with any of several types of hardware, such as digital signal processors (DSPs), general purpose programmable processors, application specific circuits, or systems-on-a-chip (SoC) such as multicore processor arrays or combinations such as a DSP and a reduced instruction set computer (RISC) processor together with various specialized programmable accelerators. A stored program in an onboard or external nonvolatile memory, such as read-only memory (ROM), programmable ROM (PROM), eraseable PROM (EPROM), electrically eraseable PROM (EEPROM, also called flash) or ferroelectric random-access memory (FRAM) could implement the signal processing methods. Analog-to-digital (A/D) and digital-to-analog (D/A) converters can provide coupling to the analog world; modulators and demodulators (plus antennas for air interfaces such as for video on cellphones) can provide coupling for transmission waveforms; and packetizers can provide formats for transmission over networks such as the Internet.

Figure 2A:
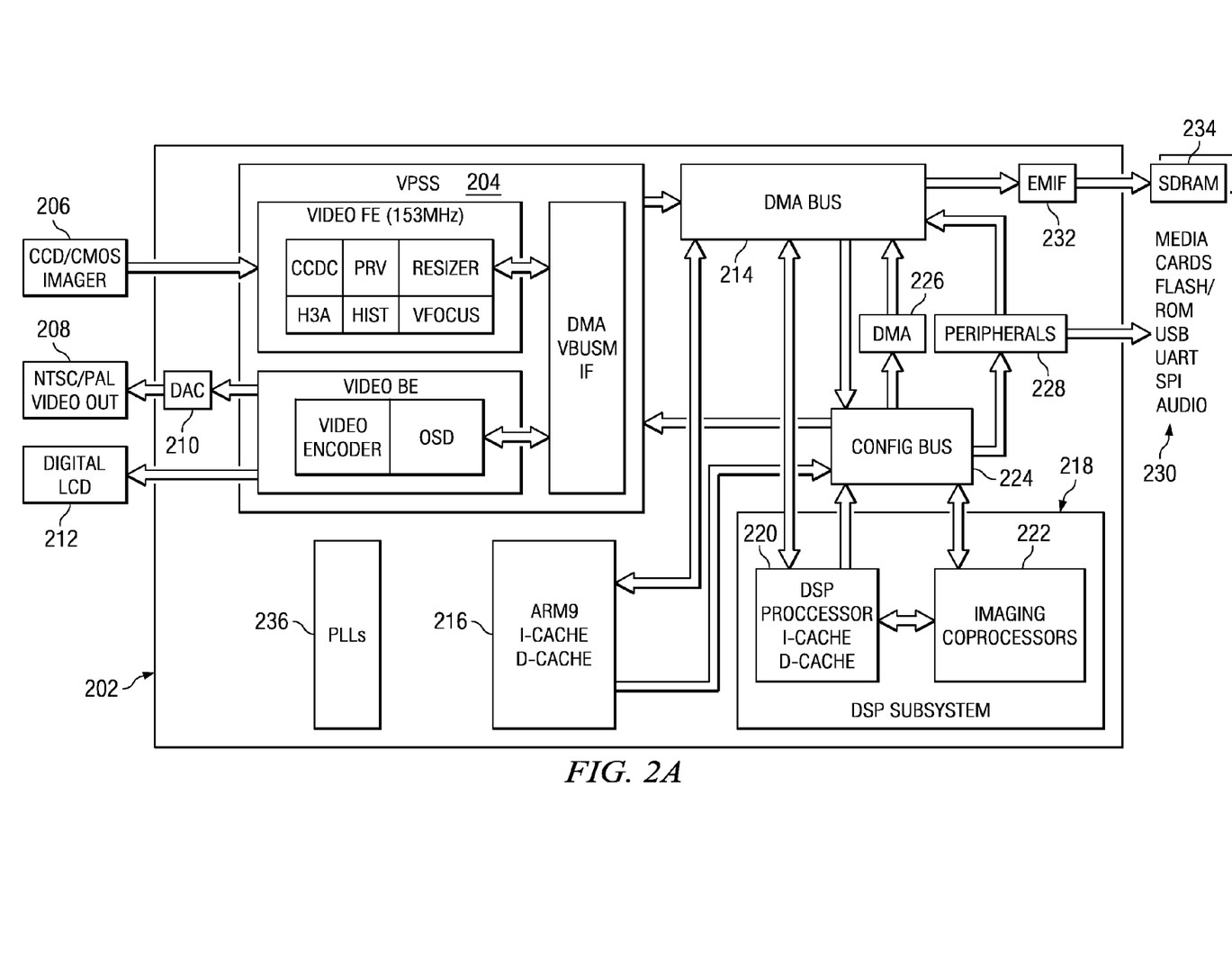
FIGS. 2A-2B respectively are a block diagram illustrating one embodiment of circuitry contained in a digital camera that forms an environment within which an accumulated statistics-based entropy coding system or method of the invention may be employed and a block diagram illustrating one embodiment of network communication carried out by the digital camera of FIG. 2A.
Figure 2B:
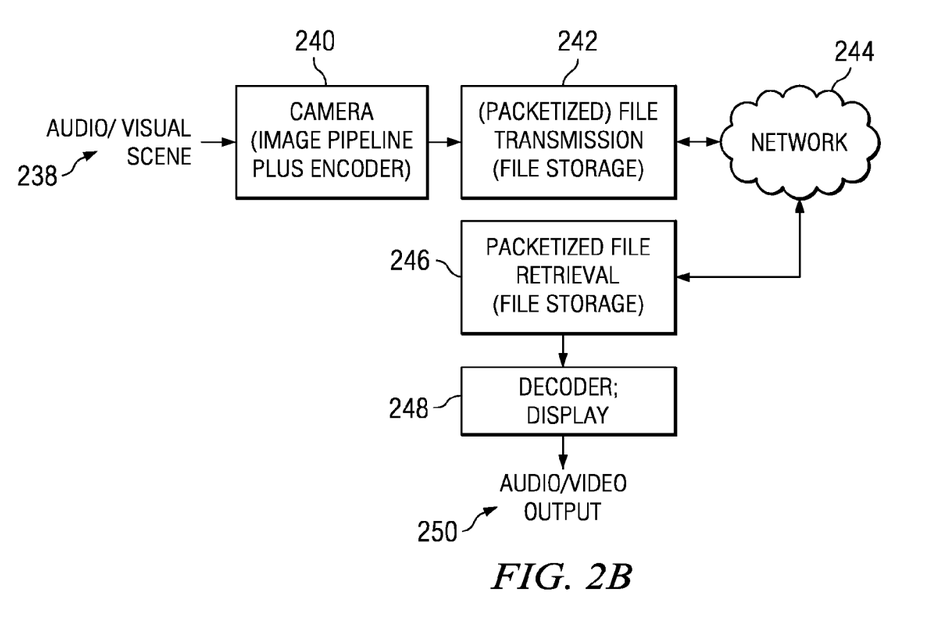

FIGS. 2A-2B illustrate one embodiment of the above. FIGS. 2A-2B respectively are a block diagram illustrating one embodiment of circuitry contained in a digital camera that forms an environment within which an accumulated statistics-based entropy coding system or method of the invention may be employed and a block diagram illustrating one embodiment of network communication carried out by the digital camera of FIG. 2A. Turning first to FIG. 2A, the digital camera contains image processing circuitry 202. The image processing circuitry 202 contains a video processing subsystem (VPSS) 204 that receives images from a CCD/CMOS image sensor 206 and performs much if not all front-end image processing. The VPSS 204 provides output to a National Television System Committee (NTSC) or Phase Alternating Line (PAL) video output 208, whichever is appropriate, via a digital-to-analog converter 210, a digital LCD 212 (typically the LCD on the back of the digital camera) and a direct memory access (DMA) bus 214.

The DMA bus 214 conveys data among a processor (e.g., a commercially available ARM9) with its associated instruction and data caches 216, a DSP subsystem 218 (containing a DSP with its associated instruction and data caches 220 and imaging processors 222), a configuration bus 224, a DMA controller 226, various peripheral interfaces 228 and an external memory interface (EMIF) 232. The peripheral interfaces 228 may lead to one or more peripheral devices 230, such as media cards, flash, read-only memory (ROM), a universal serial bus (USB), etc. The EMIF 232 provides an interface to external memory, such as synchronous dynamic random-access memory (SDRAM) 234. Various phase-locked loops (PLLs) 236 provide clock signals to synchronize the operation of the aforementioned circuitry.

For purposes of the invention, "processor" is a broad term encompassing not only general-purpose processors such as microprocessors, coprocessors, DSPs and controllers, but also programmable logic arrays (PALs) and special-purpose digital hardware capable of carrying out one or more of the methods described herein.

Turning next to FIG. 2B, the digital camera (now referenced as 240) captures an audio-visual scene 238 and creates one or more digital still or video images, perhaps including audio. The digital camera 240 may thereafter divide the digital images into packets and create a transmission 242 to a network 244 to cause them to be stored as one or more files (not shown). The one or more files may thereafter be retrieved, whereupon they are again divided into packets and a transmission 246 created. The retrieved digital images may then be passed through a decoder 248 and displayed as an audio/video output 250.

2. Preliminaries on Accumulated Statistics-Based Entropy Coding

Conventional accumulated statistics-based entropy coding techniques that form an environment within which an accumulated statistics-based entropy coding system or method of the invention may be employed will now be preliminarily considered. First, the arithmetic coding module of the JPEG 2000 standard will be explained.

Figure 3A:
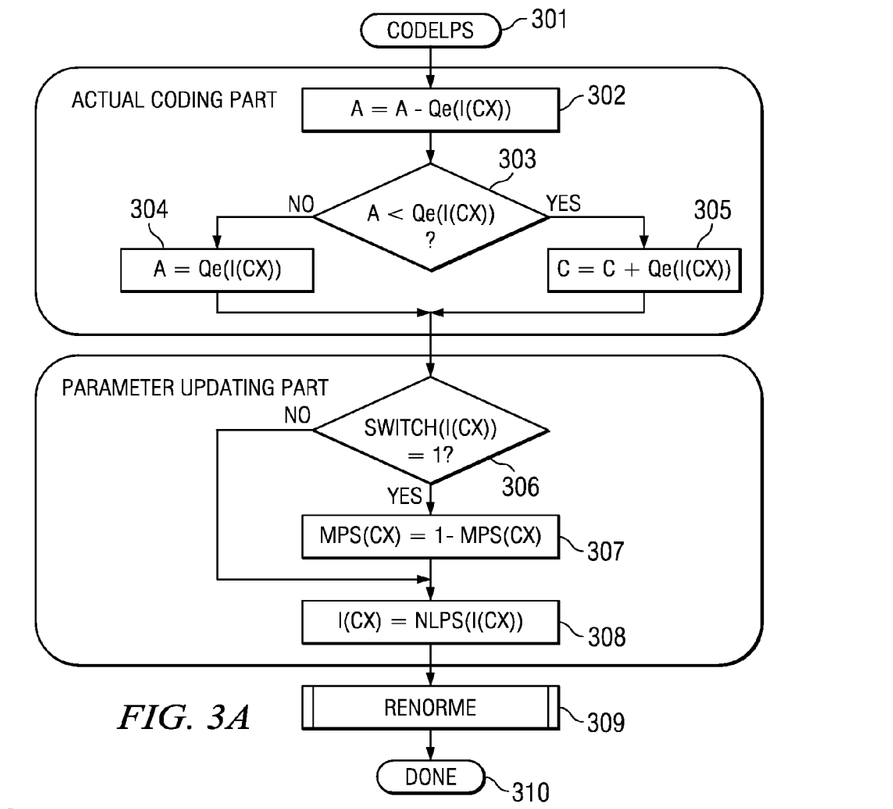
FIGS. 3A-3E are flow diagrams illustrating portions of various entropy coding methods that form an environment within which an accumulated statistics-based entropy coding system or method of the invention may be employed.
Figure 3B:
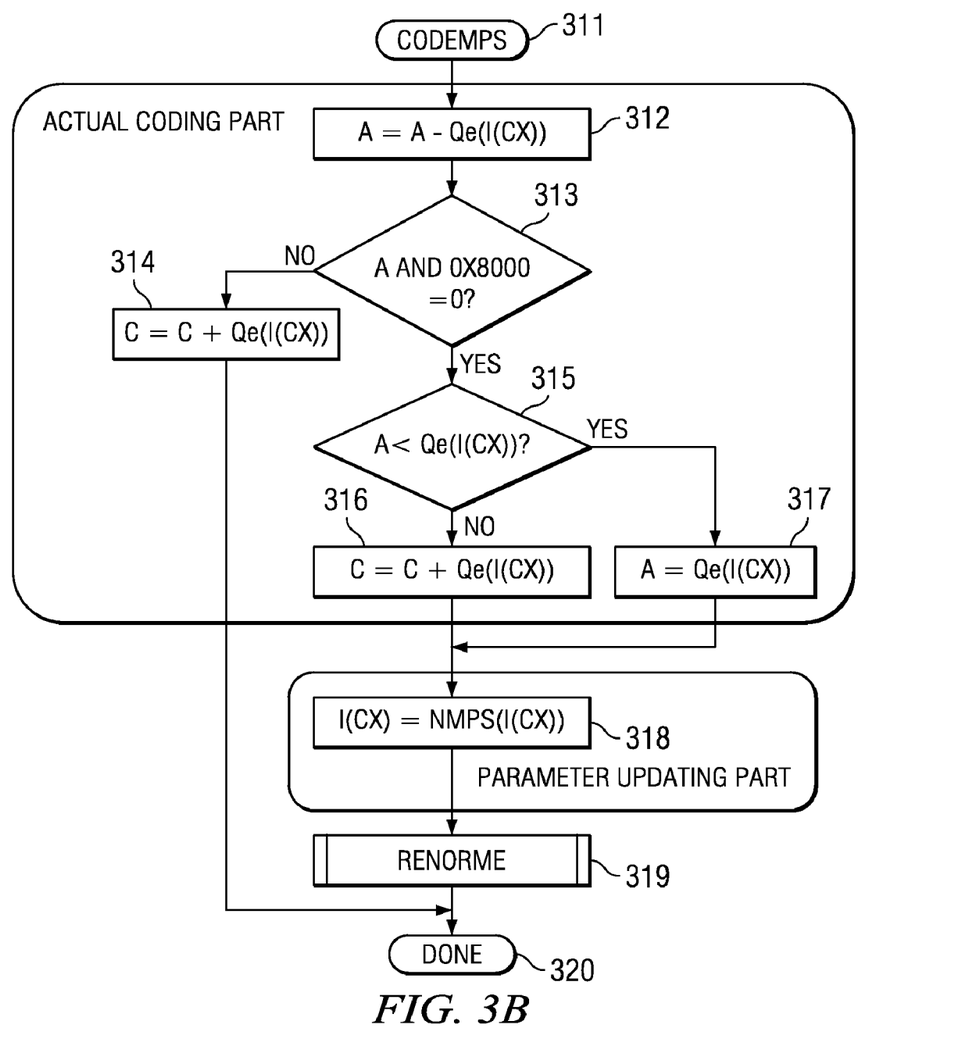

FIGS. 3A-3B show the flow diagrams of CODELPS and CODEMPS procedures, respectively, which are the core procedures of arithmetic entropy coding used in the JPEG 2000 standard. Note that the suffix "LPS" denotes a less probable symbol, and the suffix "MPS" denotes a more probable symbol. (Routines for arithmetic coding parameters initialization and coded byte data output are respectively executed before and after the core processes. Details of the initialization and output routines can be found in Annex C of JPEG 2000 standard document.) As seen in FIG. 3A and FIG. 3B, the core procedures of arithmetic coding are called CODELPS 301 and CODEMPS 311.

CODELPS 301 has two parts, an actual coding part and a parameter updating part. In the actual coding part, a new register value is computed depending upon the input decision (whether the decision is the MPS or the LPS) together with the probability state index (denoted as I(CX) in FIGS. 3A and 3B, where CX is the context, A is the register for the interval being subdivided, C is the code register, Qe is the current estimate of the LPS probability, NLPS is the next LPS index in lookup table C-2, NMPS is the next MPS index in lookup table C-2.) Blocks 302, 303, 304, 305 perform these functions. The computed register value is eventually provided as a codeword later. On the other hand, in the parameter updating part, the probability state index is updated by a table lookup determined by the input decision (i.e., NLPS or NMPS). In this way, the probability state index is updated for every coded binary decision in the arithmetic coding of JPEG 2000 standard. Blocks 306, 307, 308 perform these functions. A renorme function 309 is performed before CODELPS 301 is done in a block 310.

Likewise, CODEMPS 311 has two parts: actual coding and parameter updating. Blocks 312, 313, 314, 315, 316, 317 perform the actual coding function. Block 318 performs the parameter updating function. A renorme function 319 is performed before CODEMPS 311 is done in a block 320.

Figure 3C:
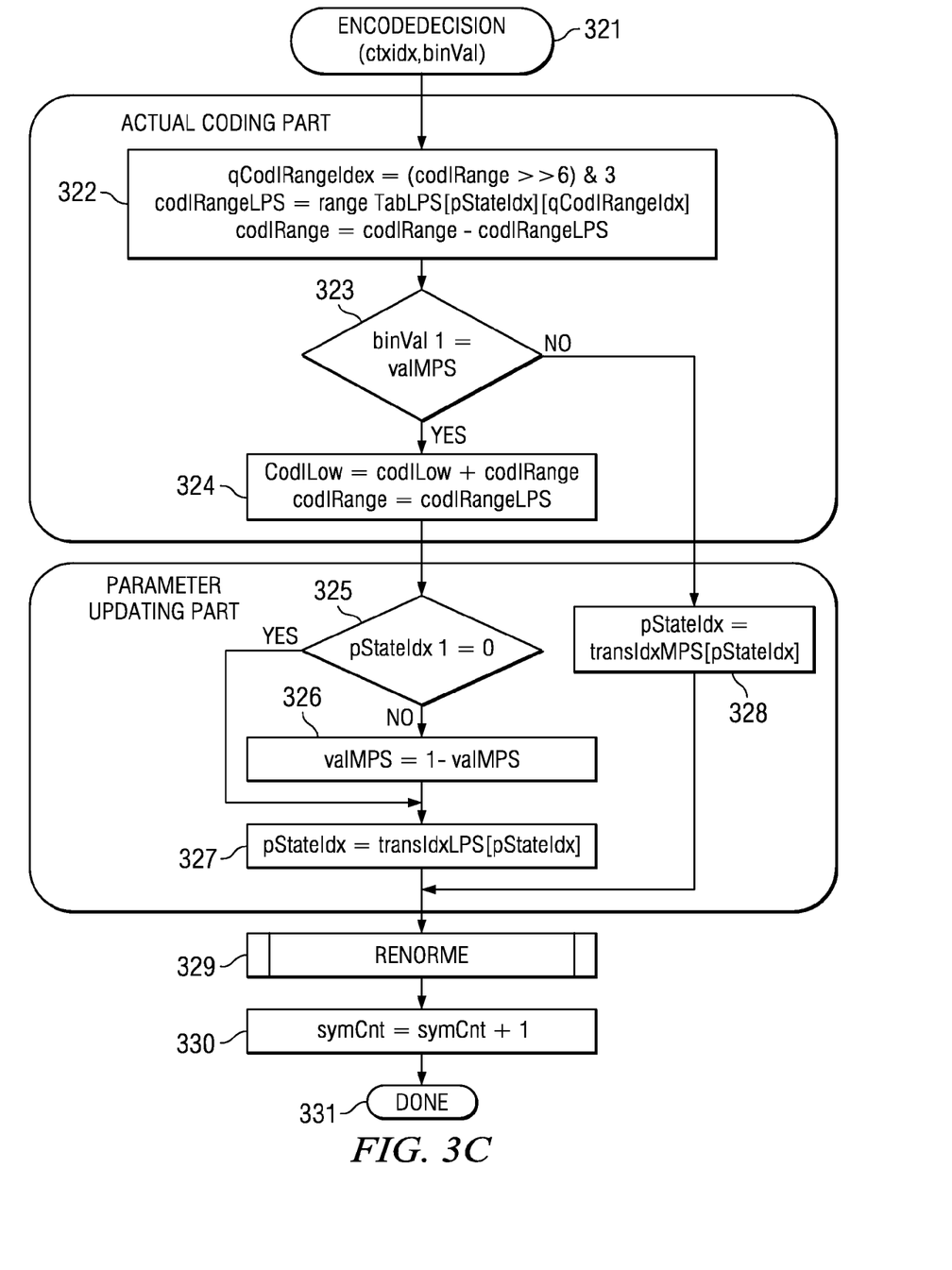

The arithmetic coding technology used in H.264/AVC standard is called CABAC (Context Adaptive Binary Arithmetic Coding). FIG. 3C shows the flow diagram of one binary decision encoding, which is the core coding procedure of CABAC. (As with JPEG 2000, there is a coding parameter initialization routine and a coded byte data output routine, and details on these routines can be found in subclause 9.3 of H.264/AVC standard document.) Similarly, the binary decision coding procedure has an actual coding part and parameter updating part. The operation performed in the actual coding part is to compute from an input 321 a new register value to be provided later as a code word. Blocks 322, 323, 324 perform these functions. The operation performed in the parameter updating part is to update the probability state index (denoted as pStateIdx in FIG. 3C). Blocks 325, 326, 327, 328 perform these functions. A renorme function 329 and an increment function 330 are performed before CABAC is done in a block 331.

In this way, updating the probability state index for every binary symbol encoded is a mandatory operation for the arithmetic coding modules used in the latest video coding standard to retain the estimated probability state up to date as much as possible. However, this frequent probability state update makes the arithmetic coding implementation more difficult, as the arithmetic coding parameter must be updated depending upon the updated probability state index before the coding of next binary symbol.

The idea of using accumulated statistics has been adopted in recent VLC coding techniques. For example, the JVT-Q040 contribution for the Scalable Video Coding (SVC) extension of H.264/AVC (i.e., Annex G) standardization proposed VLC using accumulated statistics and was adopted; this newly introduced VLC technique is called adaptive VLC. SVC generally provides progressive refinement (FGS) layers with the usual CAVLC of H.264/AVC in a base layer and VLCs for the refinement (quality enhancement) layers.

The coding of enhancement layers proceeds with a significance pass through a block of transform coefficients followed by a refinement pass. In the significance pass, rather than coding each coefficient individually, a single VLC symbol is emitted for each cycle in cyclical block coding, specifying the number of coefficients processed.

The VLCs used in the significance pass are modified start-step-stop codes, as previously described in JVT-C086 and VCEG-L19. These codes are characterized by a cutoff parameter, 'm'. Symbols less than or equal to 'm' are encoded using an exponential Golomb (Exp-Golomb) code. A symbol 'c' with value greater than 'm' is encoded in two parts: a prefix of 1s with length equal to $\lfloor (c-m)/3 \rfloor + m$, plus a "remainder" suffix of either 00, 01, or 10. Table 1, below, shows the codewords for m=2 and m=4:

TABLE 1

| | VLCs for m = 1, m = 5 | |
| Symbol | m = 1 | m = 5 |
| --- | --- | --- |
| 0 | 0 | 0 |
| 1 | 100 | 10 |
| 2 | 101 | 110 |
| 3 | 110 | 1110 |
| 4 | 11100 | 11110 |
| 5 | 11101 | 1111100 |
| 6 | 11110 | 1111101 |
| 7 | 1111100 | 1111110 |

For the significance pass, the optimal value of 'm' depends on both the starting position of the cycle, and the position of the last-coded coefficient in the base layer. The optimal value of 'm' varies widely not only between video sequences but also between frames within a given video sequence. Consequently, a context table mapping cycle start position and last-coded base position to 'm' is coded once per fine-granular scalability (FGS) slice.

Because the base layer must be processed before encoding the enhancement layer, analyzing the base layer to determine the optimal mapping need not add to encoder complexity. To minimize the overhead associated with the mapping table, monotonicity is enforced in each dimension of the already-sparse table. Thus only a record of the starting value and step points for a reasonably small number of values are needed. The coding process for the table is the same as for end-of-block (EOB) offsets (below). In the significance pass, coding the value zero (i.e., no coefficients processed) indicates an EOB.

However, the probability of an EOB is greatly influenced by cycle start position, and depending on the cycle start position it may not be the most probable symbol. To maintain a structured start-step-stop code, a vector specifying the EOB offsets to be used for each cycle start position is encoded once per frame. This vector is constrained to be monotonically decreasing as cycle number increases. For example, the vector {4 2 1 1 0 0 ... } means that the EOB should be symbol 4 in cycle 0, symbol 2 in cycle 1, symbol 1 in cycles 2 and 3, and symbol 0 (the MPS) in subsequent cycles. The first value (4) is encoded using a Golomb code with k=2, followed by the number of times each offset appears in the vector. For example, 4 appears no more times after the first value, so 0 is encoded; 3 does not appear at all, so 0 is encoded; 2 appears once so 1 is coded; 1 appears twice so 2 is coded. Thus the symbols coded are {0,0,1,2}. Performing this coding once per frame incurs minimal overhead.

An EOB symbol indicates that no block coefficients coded in the significance pass had a magnitude greater than one. This is true in the great majority of cases.

In the event that coefficients coded in the significance pass have a magnitude greater than one, the number of such coefficients (x) and the maximum magnitude (y) are combined using the formula 16x+y to give an offset value. The EOB symbol coded is the number of coefficients remaining plus the offset. Such an "overshoot condition" is easily detected at the decoder. Refinement bits then indicate the exact magnitude of each significant coefficient.

In the refinement pass, all refinement bits for a given 4×4 or 8×8 block are grouped and coded together. The JVT-P056 contribution for the Scalable Video Coding (SVC) extension of H.264/AVC introduced a CAVLC technique that considers SVC characteristics. JVT-P056 follows the same procedure as the existing H.264 in a discrete layer, but uses a VLC technique according to separate statistical characteristics in an FGS. JVT-P056 introduced a fixed VLC; however, further work in the core experiment indicates that an adaptive VLC yields a reduction in bit rate. Accordingly, a second VLC has been added, and is selected in cases where the probability of zero (as measured through observing previously-decoded refinement bits in the slice) is less than ⅞. Individual flags are used if the probability of zero is less than ⅔.

The concept of using a "coded block pattern" (CBP) is borrowed from the regular H.264/AVC standard. The bits from blocks already coded in the base layer are omitted, and a context based on the base-layer CBP value is used, but otherwise the mechanism is unchanged.

In JVT-P056, independent flags were used to indicate whether or not a 4×4 block is coded. A clear benefit results from grouping coded block flags, using the same principle as the CBP. Consequently, collect all CBFs for a given 8×8 sub-MB together.

That is, JVT-Q040 describes adaptive VLC for the refinement pass bits, coded block pattern bits, and coded block flags, which was an improvement over the prior fixed VLC method of JVT-P056. To code those variables, refinement bits and flags are grouped and adaptively coded with one of the following VLC tables (Tables 2-4, below) determined by the probability of the zero symbol.

TABLE 2

Table 0 for the Adaptive VLC

| Symbol | codeword |
|---|---|
| 0 | 0 |
| 1 | 1 |

TABLE 3

Table 1 for the Adaptive VLC

| Symbol | codeword |
|---|---|
| 000 | 0 |
| 001 | 100 |
| 010 | 101 |
| 011 | 11100 |
| 100 | 110 |
| 101 | 11101 |
| 110 | 11110 |
| 111 | 11111 |

TABLE 4

Table 2 for the Adaptive VLC

| Symbol | codeword |
|---|---|
| 0000 | 0 |
| 0001 | 100 |
| 0010 | 101 |
| 0011 | 11100 |
| 0100 | 1100 |
| 0101 | 11101 |
| 0110 | 111100 |
| 0111 | 11111100 |
| 1000 | 1101 |
| 1001 | 111101 |
| 1010 | 1111100 |
| 1011 | 11111101 |
| 1100 | 1111101 |
| 1101 | 11111110 |
| 1110 | 111111110 |
| 1111 | 111111111 |

This adaptive VLC method (introduced in JVT-Q040) achieves higher compression efficiency than the fixed VLC method (introduced in JVT-P056) by adaptively selecting the optimal VLC table determined by the estimated probability of the zero symbol. In order to estimate the probability of the zero symbol, symbol counters (denoted as 'symCount0' and 'symCount1' in JSVM-4 Annex G) are used for each variable. To maintain the adaptive VLC algorithm, two internal variable-dependent processes are used. They are called "scaling" and "updating," respectively.

The scaling process is performed to avoid the overflow of symbol counters as well as to retain the size of the counters unnecessarily large. This scaling process can be modeled as set forth in Table 5, below, where 'symCount[0]' and 'symCount[1]' are the symbol counters while 'scaleLimit' and 'scaleFactor' are the CAVLC internal variables:

TABLE 5

Model1

```
if  ((symCount[0] + symCount[1]) > scaleLimit){
    symCount[0] = symCount[0] >> scaleFactor;
    symCount[1] = symCount[1] >> scaleFactor;
}
```

Summation of the symbol counters is compared with the threshold named scaleLimit, and each counter is right-shifted by the variable named scaleFactor if the summation is larger than the threshold. This scaling process has one conditional operation and conditionally subsequent arithmetic operations.

Meanwhile, the updating process is performed to select the optimal VLC table at the moment. This updating process can be modeled as set forth in Table 6, below, where 'symCount[0]' and 'symCount[1]' are the symbol counters while 'leadinPeriod' and 'flipFlag' are the CAVLC internal variables, and vlcTable' is the updated VLC table:

TABLE 6

Model2

```
if  ((symCount[0] + symCount[1]) > leadinPeriod){
    flipFlag = (symCount[0] < symCount[1]) ? 1 : 0;
    vlcTable = (symCountppFlag] < 2*symCount[1 -flipFlag]) ? 0;
    :(7*symCount[1-flipFlag] <= symCountppFlag]) ? 2 : 1;
}
```

Similarly, summation of the symbol counters is compared with the threshold named leadinPeriod, and each variable (namely, flipFlag and vlcTable) is updated according to the ratio of the counters if the summation is larger than the threshold. This updating process has one conditional operation and further conditional operations which is conditionally operated.

Accordingly, it can be seen from the above models that both scaling and updating processes contain one conditional operation and conditionally subsequent arithmetic operations (i.e., bit-shift) or further conditional operations.

This adaptive VLC algorithm presented here is already implemented in Joint Scalable Video Model (JSVM) JSVM-4 software, and also described in G.9.4 of JSVM-4 Annex G.

Figure 3D:
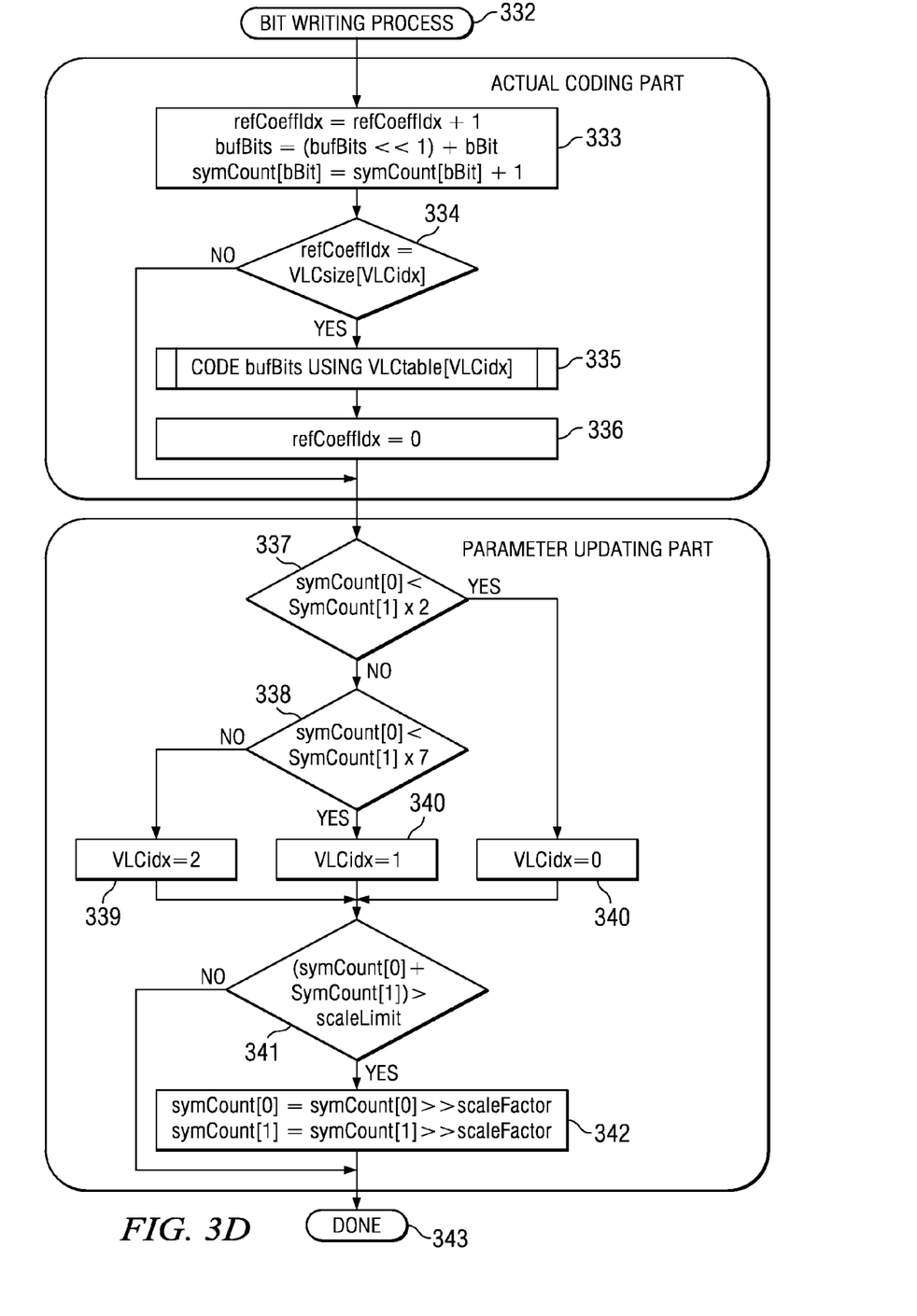

In short, the adaptive VLC scheme chooses the optimal VLC table for each coded symbol determined by the estimated probability, and the estimated probability is computed from the accumulated symbol counters. FIG. 3D shows the flow diagram of bit writing process used in this adaptive VLC scheme. Essentially, the adaptive VLC scheme selects the optimal VLC table from the estimated probability balance which is computed from the accumulated symbol counts. Then, the symbol is coded with the adaptively selected VLC tables. As seen in FIG. 3D, this adaptive VLC scheme also has an actual coding part and a parameter updating part. In the actual coding part, the grouped bits with the size of the selected VLC table are coded with the selected table. Blocks 332, 333, 334, 335, 336 perform these functions. In the parameter updating part, VLC table selection is determined by the symbol counts, and the symbol counter is scaled to avoid overflow. Blocks 337, 338, 339, 340, 341, 342 perform these functions. The adaptive VLC scheme ends in a block 343. Because the result of VLC table selection in the updating part influences the coding module of next symbol, efficient implementation (e.g., pipelined processing) of this adaptive VLC scheme is difficult.

Figure 3E:
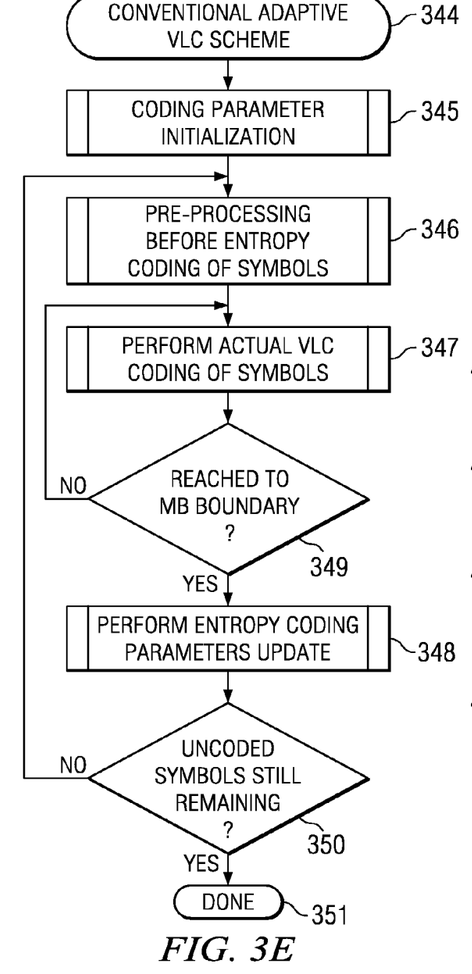

The adaptive VLC scheme has as its target the flow diagram of FIG. 3E. The adaptive VLC scheme is referenced as 344. Coding parameters are initialized in a block 345. Pre-processing before entropy coding occurs in a block 346. Actual coding occurs in a block 347. Parameter updating occurs in a block 348. A boundary test is carried out in a block 349. A further test to determine whether any unencoded symbols remain is carried out in a block 350. The method ends in a block 351.

The common characteristics of conventional accumulated statistics-based entropy coding schemes can be summarized as follows:

They have two parts: an actual coding part and a parameter updating part.

Their computation is relatively complex as they contain several conditional operations within one bit symbol coding module.

The coding parameter updating operation is performed for every single coded symbol.

The efficient implementation of such an entropy coding scheme is difficult, as the result of coding parameter update must be fetched before coding the next symbol.

Therefore, various embodiments of the method carried out according to the principles of the invention provide an accumulated statistics-based entropy coding technique with less computational intensity but without losing much compression efficiency.

3. Discrete Point (Condition) Parameter Updating for Entropy Encoding

Figure 4A:
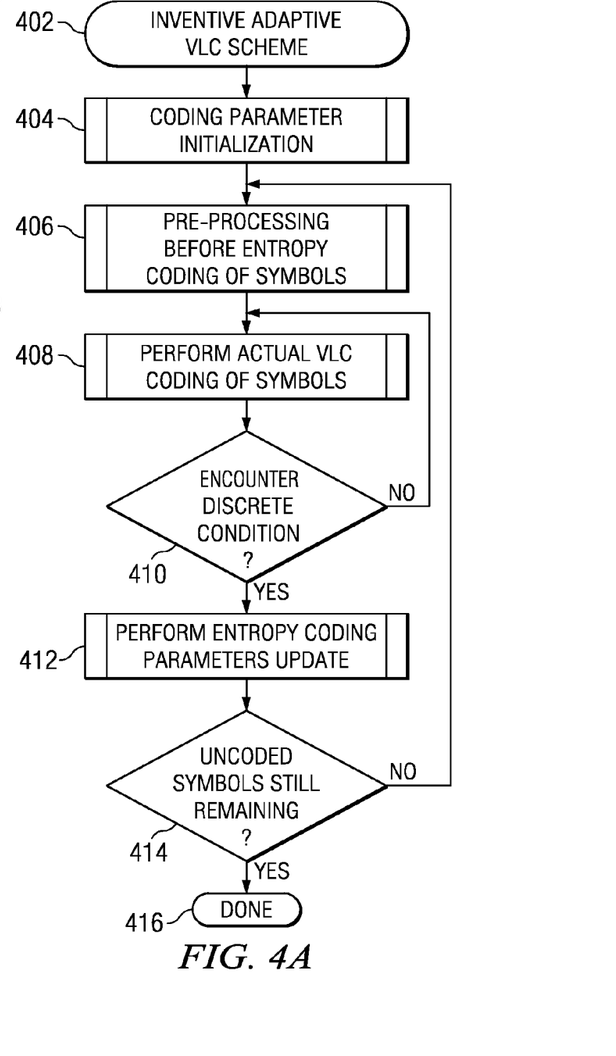
FIGS. 4A-4C are flow diagrams illustrating portions of an accumulated statistics-based entropy coding method carried out according to the principles of the invention.
Figure 4B:
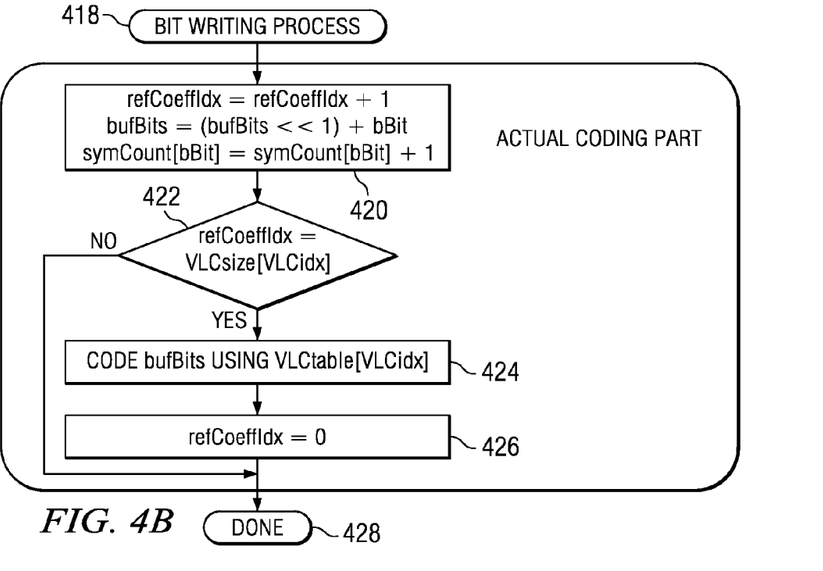
Figure 4C:
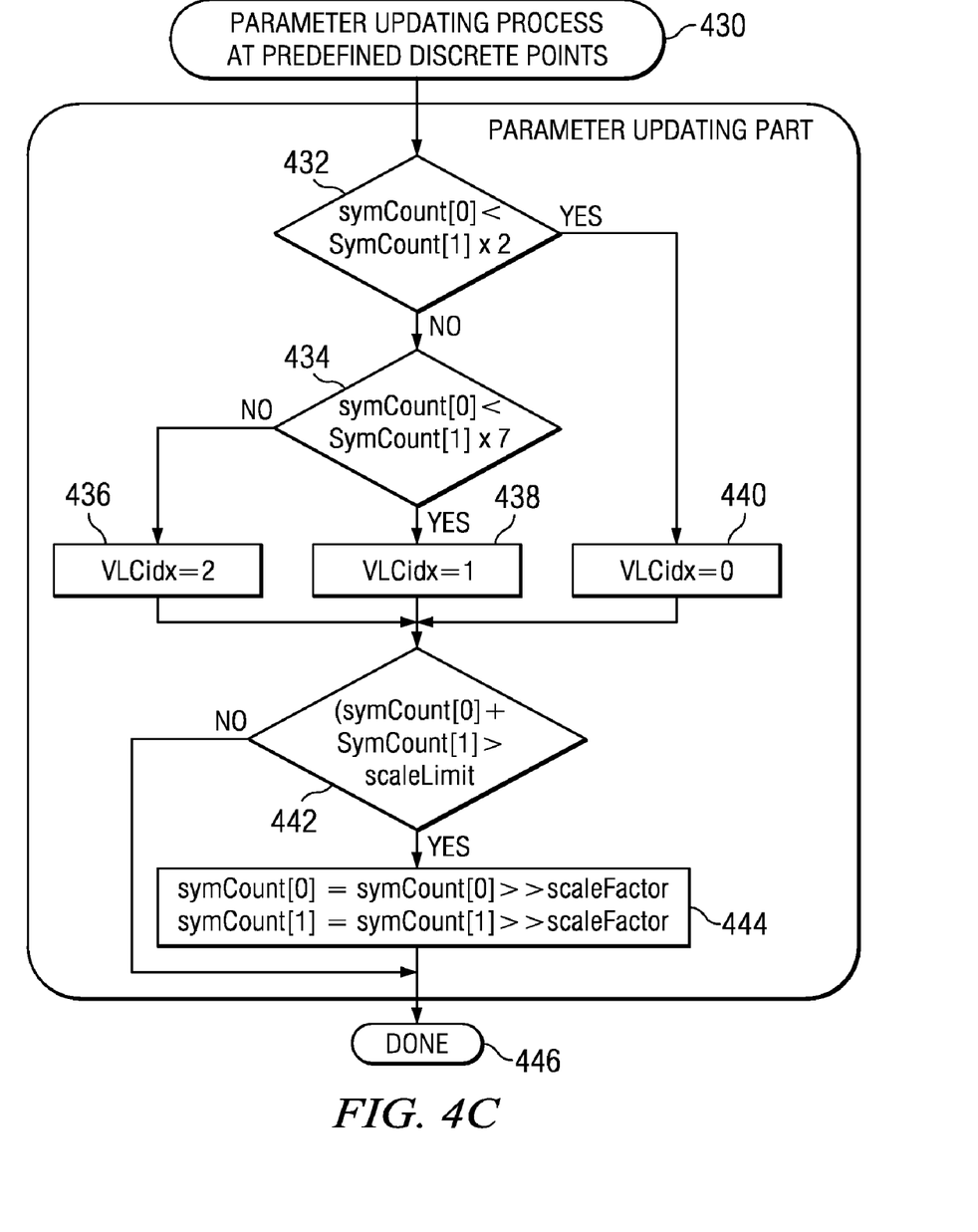

The illustrated embodiments are directed to variations of a method for reducing the complexity of video coding technology using accumulated-statistics-based entropy coding schemes by making the entropy coding parameter updating part (a first module) asynchronous with actual symbol coding part (a second module). FIGS. 4A-4C are flow diagrams illustrating portions of an embodiment of the method. The method, which takes its input from an adaptive VLC scheme 402, includes the following steps:

(a) Initialize entropy coding parameters as directed in a target conventional video coding standard (e.g., Arithmetic coding of JPEG 2000, CABAC of H.264/AVC, or adaptive VLC of SVC) (step 404).

(b) Perform (pre-)processing operations before the entropy coding of symbols if necessary (step 406).

(c) Start the core entropy coding process by performing the "actual coding part" of the target (step 408).

(d) Skip the "parameter updating part" of the target, and finish the core entropy coding process for one symbol.

(e) Repeat steps (c) and (d) until one of a set of predefined discrete conditions (points) is encountered for the target (e.g., one to several syntax elements are encountered, one to several macroblocks are completed, or one cycle of coefficient scan for most video coding standards; one coding pass, one bit-plane, or a scan of four coefficients for the JPEG 2000 standard) (step 410).

(f) At such predefined discrete points, perform the "parameter updating part" of the target to update the entropy coding parameters (step 412).

(g) Repeat steps (b) through (f) until all symbols are coded with the target entropy coder, which involves determining whether any unencoded symbols remain (step 414). The method ends in a step 416.

The point of the above method is that computational complexity is decreased by performing the "parameter updating part" less frequently and only at some predefined discrete point rather than at every coded symbol. Also, the more efficient implementation is achieved more easily with this methodology because the actual coding part and the parameter updating part are completely separated. Since coding procedures tend to be modularized by some discrete points, the actual coding part is performed more efficiently within a module. The method is applicable to standalone or together with other schemes reducing the computational complexity of the video coding technologies.

The encoder that carries out the method has an actual coding part, shown in FIG. 4B, and a parameter updating part, shown in FIG. 4C. With reference to FIG. 4B, a bit writing process 418 provides input to the actual coding part. Blocks 420, 422, 424, 426 perform the functions in the actual coding part, which is done in a block 428. With reference to FIG. 4C, parameter updating occurs only at predefined discrete points 430 that occur less frequently than at every coded symbol. Blocks 432, 434, 436, 438, 440, 442, 444 perform the functions in the parameter update part, which is done in a block 446.

4. An Embodiment with Target Adaptive VLC

To explain the method carried out according to the principles of the invention more explicitly, consider the method applied to adaptive VLC scheme of SVC described in Section 2, above, which has as its target the flow diagram of FIG. 3E.

The issue raised in Section 2 is that scaling and updating processes are performed after every codeword is (de)coded under the current adaptive VLC implementation in JSVM software. Two problems exist with respect to such an implementation. One of them is complexity, and the other one is causality.

With regard to complexity, a problem exists that the scaling and updating processes are too frequent. As explained before, each of scaling and updating processes contains one conditional operation and conditionally subsequent operations. In other words, at least two conditional operations are performed at every codeword boundary, which can be as small as one refinement bit under the current implementation. Accordingly, it can be considered that the current implementation of the adaptive VLC contains unnecessary computational complexity even though the main advantage of CAVLC over CABAC is a decreased complexity.

With regard to causality, a problem exists that the VLC selection for the current codeword depends upon the decoded value from previous codeword. That is, completely decoding the previous codeword is mandatory to update the VLC table and then decode the current codeword. This is quite problematic to implement in the refinement pass decoding process with some pipelined structures.

To solve the above two problems, the method carried out according to the principles of the invention provide the following two modifications to the current adaptive VLC technique. One modification is to perform scaling and updating processes after every macroblock (de)coding of one refinement pass scan instead of after every codeword (de)coding. This modification will reduce the complexity of adaptive VLC by decreasing the number of scaling and updating processes. In addition, it will make a macroblock-based pipelined decoding process much easier and more efficient, as VLC table and other related internal variables are unchanged within a macroblock decoding process.

The other modification is to omit the comparison of summation of symbol counters and the threshold, leadinPeriod, in updating process. It will further reduce the complexity of adaptive VLC because one conditional operation is saved.

FIG. 4A shows the modification of the target adaptive VLC scheme by the method carried out according to the principles of the invention using a macroblock boundary as the discrete point for parameter updating. The method is based on the realization that coding parameter updating is performed too frequently in conventional video coding standards, and less frequent coding parameter updating should not degrade compression efficiency too much. If the above assumption is correct, it is expected that the illustrated embodiments of the method of the invention should decrease the computational complexity of the accumulated statistics-based entropy coding without sacrificing significant compression efficiency.

A detailed description of method steps (a) to (g) of Section 3, above, follows. First, no explanation is needed for steps (a) to (c), as they are the conventional steps. For step (d), the method will skip the parameter updating process here and perform it in step (f) later because performing parameter updating for every coded symbol is not a mandatory process of entropy coding although it could affect the compression efficiency. Then, step (e) establishes the "predefined discrete point," and the parameter updating process is performed here instead. This predefined discrete point may be anything, depending on the requirement of the encoder/decoder implementation (e.g., a syntax element, multiple syntax elements, a macroblock, multiple macroblocks or a coding pass), but it is desirable to be some processing unit of the implementation. For example, a macroblock or macroblock pair should be desirable for typical video coding standard, while a scan of four coefficients or one coding pass of a codeblock would be desirable for JPEG 2000 standard.

By the modification, the implementation of core symbol coding process should be much more efficient, as the coding parameter updating process is completely separated from the core coding process, and it does not need to wait for the updated coding parameter before coding the next symbol. Moreover, the number of coding parameter updating process performed is decreased, and it should lead to the overall complexity reduction. Based on the above ideas, the method is realized as described in FIG. 4A as an example.

5. Results

Performance results for some embodiments of the method carried out according to the principles of the invention will now be described. Again, the method is implemented in the adaptive VLC scheme, and the effect of the method is measured by comparing the conventional VLC scheme with the adaptive VLC scheme with method.

Needless to say, the positive effects of the method are the simplification of core coding process and the computational complexity reduction. The simplification of core coding procedure will lead to the more efficient entropy coding implementation, but proving it is not trivial under the circumstances. Table 7, below, shows the number of coding parameter updating procedures performed with and without one embodiment of the method. As Table 7 shows, the number of updating process is reduced by 60-80%, which simply leads to the substantial complexity reduction.

TABLE 7

Coding Parameter Updating Procedures Performed

| | Conventional Method | Embodiment of the New Method | Reduction |
|---|---|---|---|
| QCIF | | | |
| Bus | 300,334 | 66,377 | 77.9% |
| Football | 1,078,435 | 192,548 | 82.1% |
| Foreman | 320,925 | 79,689 | 75.2% |
| Mobile | 478,865 | 139,175 | 70.9% |
| City | 395,823 | 86,602 | 78.1% |
| Crew | 714,150 | 181,178 | 74.6% |
| Harbour | 769,975 | 164,247 | 78.7% |
| Soccer | 562,594 | 127,230 | 77.4% |
| CIF | | | |
| Bus | 1,146,587 | 305,734 | 73.3% |
| Football | 4,144,825 | 944,795 | 77.2% |
| Foreman | 1,165,634 | 340,062 | 70.8% |

TABLE 7-continued

Coding Parameter Updating Procedures Performed

|  | Conventional Method | Embodiment of the New Method | Reduction |
|---|---|---|---|
| Mobile | 1,908,261 | 598,067 | 68.7% |
| City | 1,494,826 | 355,789 | 76.2% |
| Harbour | 3,408,196 | 857,150 | 74.9% |
| Soccer | 2,376,350 | 592,532 | 75.1% |
| 3CIF |  |  |  |
| City | 11,974,622 | 4,372,721 | 63.5% |
| Crew | 14,622,711 | 4,771,756 | 67.4% |
| Harbour | 16,577,868 | 4,908,917 | 70.4% |
| Soccer | 11,327,147 | 3,555,490 | 68.6% |

On the other hand, there may be some concerns on the degradation of compression efficiency by the invented method, shows the effect of invented method on bit rate and peak signal-to-noise ratio (PSNR). Because the method only adds modification to the entropy coding algorithm, the PSNR values are unchanged. As Table 8, below, shows, one embodiment of the method increases the bit rate only up to 0.021% and 0.005% on average, which is negligible.

based entropy coding schemes (e.g., CABAC used in H.264, arithmetic coding used in JPEG 2000) due to the similar principles of the coding schemes. Also, the method may be helpful when creating a new video coding standard based on a current coding standard. To sum up, the effects of various embodiments of the method of the invention are summarized and listed as follows:

- The computational complexity of core entropy coding process of accumulated statistics-based entropy coding is reduced substantially, as number of coding parameter updating process is reduced by 60-80% in the example of adaptive VLC scheme.
- More efficient implementation (e.g., low delay and/or pipelined processing) should be realized.
- The negative effect of the invented method is negligible, as the bit rate increase is only up to 0.021% and 0.005% on average for adaptive VLC scheme.

6. Modifications

The illustrated embodiments may be modified in various ways while retaining one or more of the features of separating context-adaptive coding and the updating of the accumulated statistics variables used for context.

For example, the updating could be for tables related to coeff_refinement_flag and coeff_refinement_direction_flag which are for bits and signs employed in a refinement pass of

TABLE 8

Bit Rates and PSNR

| | Conventional Method | | | | Embodiment of New Method | | | | | Difference | | |
|---|---|---|---|---|---|---|---|---|---|---|---|---|
| | Bit Rate (Kbps) | Y-PSNR (dB) | U-PSNR (dB) | V-PSNR (dB) | Bit Rate (Kbps) | Y-PSNR (dB) | U-PSNR (dB) | V-PSNR (dB) | Diff | V-PSNR | U-PSNR | V-PSNR |
| QCIF | | | | | | | | | | | | |
| Bus | 816.0 | 43.91 | 46.79 | 47.98 | 816.1 | 43.91 | 46.79 | 47.98 | 0.005% | 0.00 | 0.00 | 0.00 |
| Football | 1230.1 | 46.20 | 47.75 | 48.16 | 1230.2 | 46.20 | 47.75 | 48.16 | 0.013% | 0.00 | 0.00 | 0.00 |
| Foreman | 522.1 | 45.47 | 47.54 | 48.38 | 522.2 | 45.47 | 47.54 | 48.38 | 0.011% | 0.00 | 0.00 | 0.00 |
| Mobile | 866.1 | 42.79 | 43.76 | 43.56 | 866.2 | 42.79 | 43.76 | 43.56 | 0.009% | 0.00 | 0.00 | 0.00 |
| City | 658.6 | 47.51 | 49.40 | 50.04 | 658.7 | 47.51 | 49.40 | 50.04 | 0.021% | 0.00 | 0.00 | 0.00 |
| Crew | 905.4 | 45.64 | 46.82 | 46.60 | 905.5 | 45.64 | 46.82 | 46.60 | 0.008% | 0.00 | 0.00 | 0.00 |
| Harbour | 973.5 | 45.56 | 48.35 | 49.56 | 973.6 | 45.56 | 48.35 | 49.56 | 0.006% | 0.00 | 0.00 | 0.00 |
| Soccer | 730.0 | 46.51 | 48.81 | 49.89 | 730.0 | 46.51 | 48.81 | 49.89 | 0.011% | 0.00 | 0.00 | 0.00 |
| CIF | | | | | | | | | | | | |
| Bus | 3937.8 | 41.87 | 45.65 | 47.34 | 3938.0 | 41.87 | 45.65 | 47.34 | 0.005% | 0.00 | 0.00 | 0.00 |
| Football | 5938.8 | 45.20 | 47.57 | 48.22 | 5939.1 | 45.20 | 47.57 | 48.22 | 0.005% | 0.00 | 0.00 | 0.00 |
| Foreman | 2726.6 | 43.50 | 46.44 | 47.91 | 2726.6 | 43.50 | 46.44 | 47.91 | 0.000% | 0.00 | 0.00 | 0.00 |
| Mobile | 3933.6 | 40.47 | 41.87 | 41.88 | 3933.8 | 40.47 | 41.87 | 41.88 | 0.003% | 0.00 | 0.00 | 0.00 |
| City | 3472.9 | 45.30 | 48.16 | 49.18 | 3473.0 | 45.30 | 48.16 | 49.18 | 0.003% | 0.00 | 0.00 | 0.00 |
| Crew | 4406.3 | 44.43 | 46.07 | 46.61 | 4406.4 | 44.43 | 46.07 | 46.61 | 0.001% | 0.00 | 0.00 | 0.00 |
| Harbour | 5263.0 | 42.87 | 46.93 | 48.20 | 5263.0 | 42.87 | 46.93 | 48.20 | 0.000% | 0.00 | 0.00 | 0.00 |
| Soccer | 3827.5 | 45.06 | 48.30 | 49.60 | 3827.7 | 45.06 | 48.30 | 49.60 | 0.004% | 0.00 | 0.00 | 0.00 |
| 3CIF | | | | | | | | | | | | |
| City4 | 34181.5 | 43.78 | 47.47 | 48.74 | 34181.6 | 43.78 | 47.47 | 48.74 | 0.000% | 0.00 | 0.00 | 0.00 |
| Crew4 | 30756.3 | 43.45 | 45.06 | 46.76 | 30756.5 | 43.45 | 45.06 | 46.76 | 0.001% | 0.00 | 0.00 | 0.00 |
| Harbour4 | 31768.5 | 42.21 | 46.66 | 48.16 | 31768.8 | 42.21 | 46.66 | 48.16 | 0.001% | 0.00 | 0.00 | 0.00 |
| Soccer | 26910.3 | 44.17 | 47.61 | 49.04 | 26910.5 | 44.17 | 47.61 | 49.04 | 0.001% | 0.00 | 0.00 | 0.00 |

| | Diff | Y-PSNR | U-PSNR | V-PSHR |
|---|---|---|---|---|
| Average | 0.005% | 0.00 | 0.00 | 0.00 |
| Min | 0.000% | 0.00 | 0.00 | 0.00 |
| Max | 0.021% | 0.00 | 0.00 | 0.00 |

Only the effects of the method for adaptive VLC scheme used in the SVC standard have been described herein, but similar effects are expected for other accumulated statisticsa block of transform coefficients and computed from indices and the accumulated statistics variables: refCoeffIdx, coefRefVlcSymbolGroup and coeffRefVlcSymbolBuf[ ] (which is the buffer for the coefficient refinement symbols in the Group of three coeff_ref_vlc_symbols), and with refVlcSelector for codeword table selection. Accumulated statistics counters refSymCount0, refSymCount1, refSymCount2 are adjusted and determine refVlcSelector when updating.

Those skilled in the art to which the invention relates will appreciate that other and further additions, deletions, substitutions and modifications may be made to the described embodiments without departing from the scope of the invention.

What is claimed is:

1. A system, comprising:
   A. a memory configured to contain initialized accumulated statistics coding variable values; and
   B. a processor configured:
      i. to employ said initialized accumulated statistics coding variable values to context-adaptive encode multiple symbols until an accumulated statistics update condition occurs, and
      ii. to update and store said accumulated statistics coding variable values in said memory only upon occurrence of said accumulated statistics update condition.

2. The system as recited in claim 1 wherein said accumulated statistics update condition is selected from the group consisting of:
   completion of a coding of a syntax element,
   completion of a coding of multiple syntax elements,
   completion of a coding of a macroblock,
   completion of a coding of multiple macroblocks, and
   completion of a coding pass.

3. The system as recited in claim 1 wherein said processor is further configured to repeat said context-adaptive encoding and said updating until all symbols to be encoded are encoded.

4. The system as recited in claim 1 wherein said initialized accumulated statistics coding variable values are initialized in accordance with one selected from the group consisting of:
   context-adaptive variable-length coding (CAVLC),
   context-based adaptive binary arithmetic coding (CABAC), arithmetic entropy coding, and
   adaptive variable-length coding (VLC).

5. The system as recited in claim 1 wherein said memory contains a plurality of variable-length coding (VLC) tables and said processor is further configured to retrieve codewords from a selected one of said plurality.

6. The system as recited in claim 1 wherein said updating is used either alone or together with a complexity reduction method for entropy coding.

7. A system, comprising:
   A. a memory configured to contain plural, initialized accumulated statistics coding variable-length coding (VLC) tables; and
   B. a processor configured:
      i. to retrieve codewords from a selected one of the plural, initialized accumulated statistics coding variable-length coding (VLC) tables to context-adaptive encode multiple symbols until an accumulated statistics update condition occurs, and
      ii. to update and store said accumulated statistics coding variable values in said memory only upon occurrence of said accumulated statistics update condition.

* * * * *